United States Patent [19]

Haines

[11] 4,017,793
[45] Apr. 12, 1977

[54] PRINTED CIRCUIT BOARD CIRCUIT TESTER

[76] Inventor: Fred E. Haines, 2444 Cabrillo Ave., Torrance, Calif. 90501

[22] Filed: July 6, 1976

[21] Appl. No.: 702,881

Related U.S. Application Data

[63] Continuation-in-part of Ser. No. 603,332, Aug. 11, 1975, abandoned.

[52] U.S. Cl. .................. 324/73 PC; 324/73 R; 324/158 F; 269/21; 269/22
[51] Int. Cl.[2] .................. G01R 31/02; G01R 15/12
[58] Field of Search ........ 324/73 PC, 73 R, 73 AT, 324/158 F, 158 P; 269/21, 22

[56] References Cited
UNITED STATES PATENTS

| | | | |
|---|---|---|---|
| 3,617,045 | 11/1971 | Costa et al. | 269/21 |
| 3,714,572 | 1/1973 | Ham et al. | 324/158 F |
| 3,757,219 | 9/1973 | Aksu | 324/158 F |

*Primary Examiner*—Rudolph V. Rolinec
*Assistant Examiner*—Vincent J. Sunderdick
*Attorney, Agent, or Firm*—Huebner & Worrel

[57] ABSTRACT

A tester for printed circuit board circuits having an elastomeric member on which printed circuit boards are positioned for testing. When a pressure differential is created across the member, the circuit board being tested is moved into contact with electrical leads connected to a computer programmed with respect to the circuits being tested. The circuit board is supported on the elastomeric member by a thin non-conducting, sealing foam sheet having a cutaway central portion to permit the circuit to make contact with the leads which extend through openings in the elastomeric member and outwardly thereof. Under the thin foam is, preferably, a non-conducting sheet of thicker foam, both layers of foam being supported on the elastomeric member, and being movable by the pressure differential to lower the foam layers with respect to the electrical leads and also to lower the circuit board to make contact with the leads. Means are provided to automatically align the board on the tester and a switch is provided to be actuated by the circuit board to cause the pressure differential to be automatically created when the board is in place.

A multiple unit device for testing any of a plurality of circuit board configurations without rewiring employs a plurality of different sealing foam sheets to mask out all but one of the testing units at any one time.

20 Claims, 11 Drawing Figures

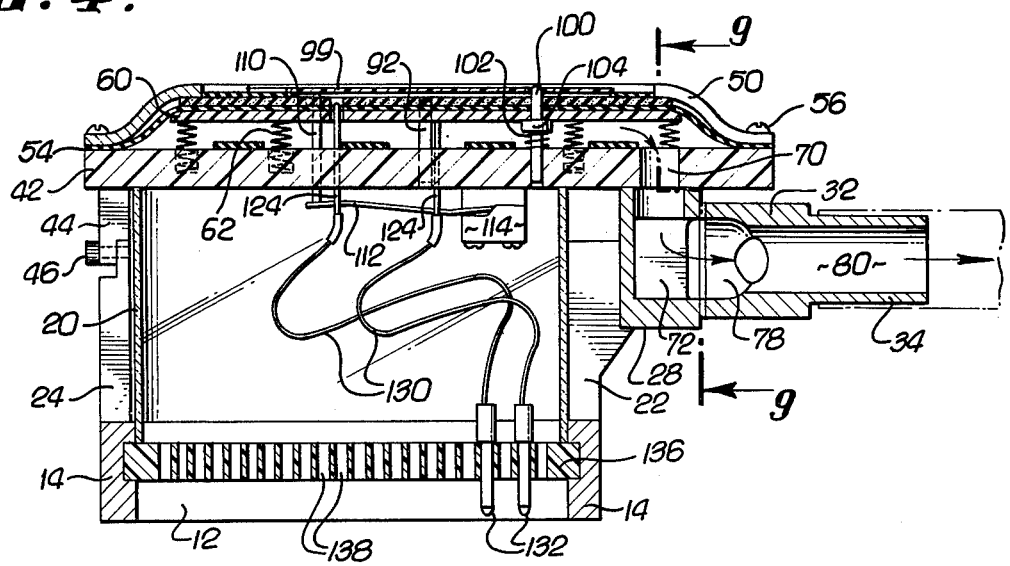
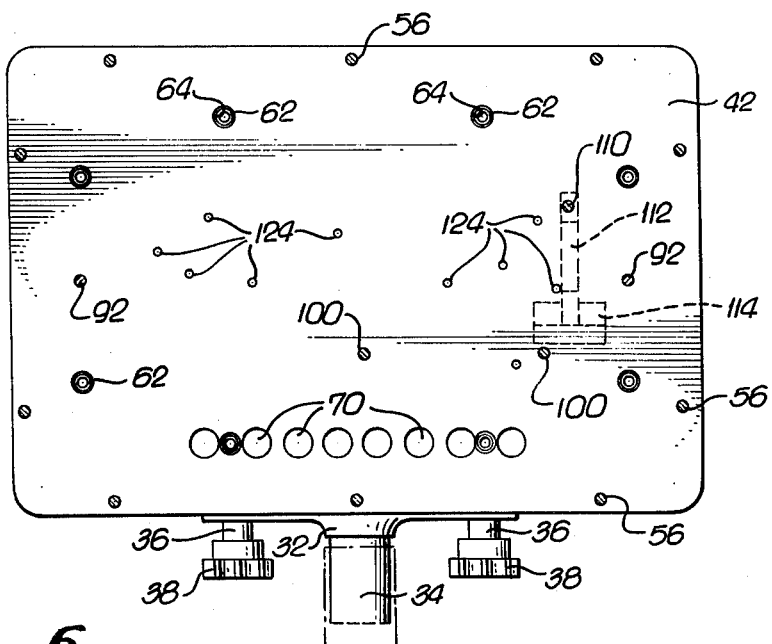
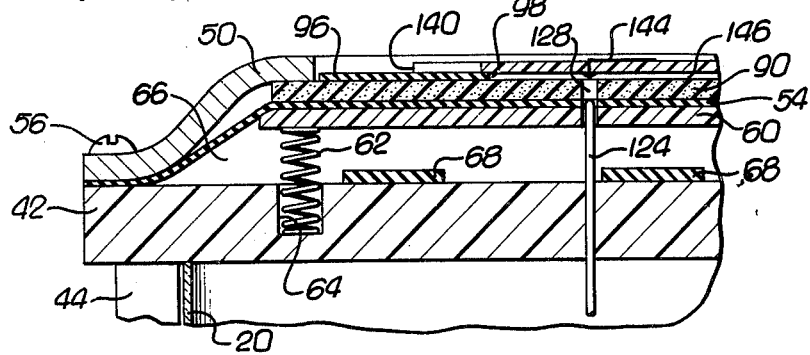

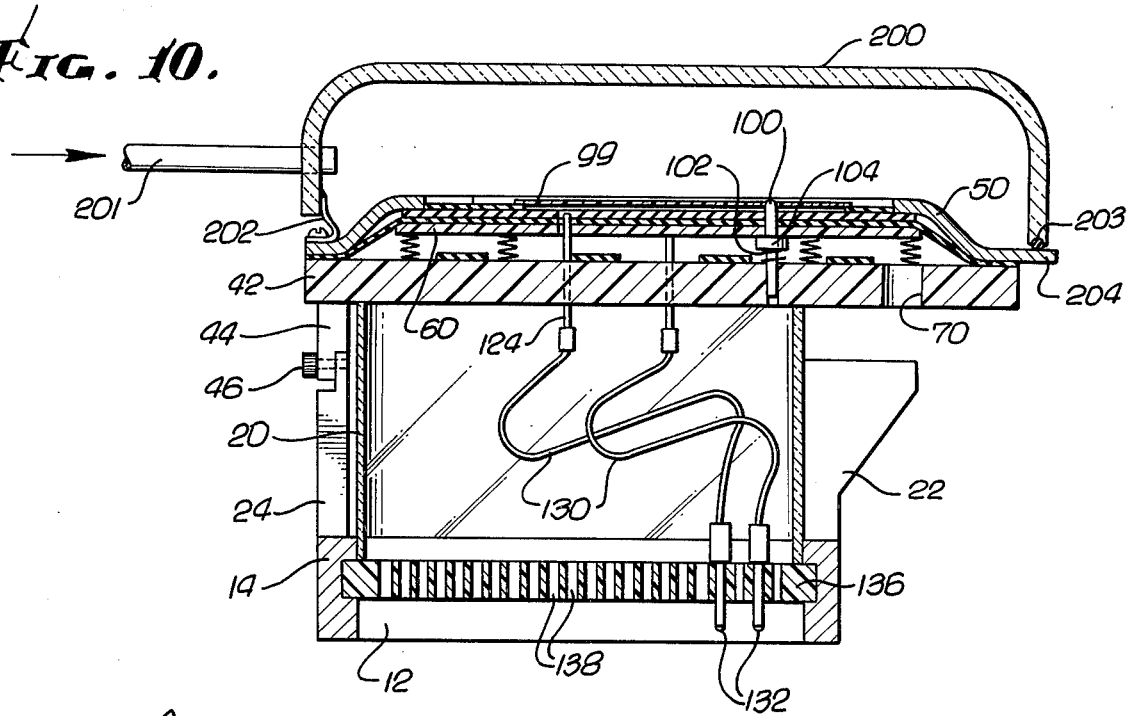
FIG. 10.
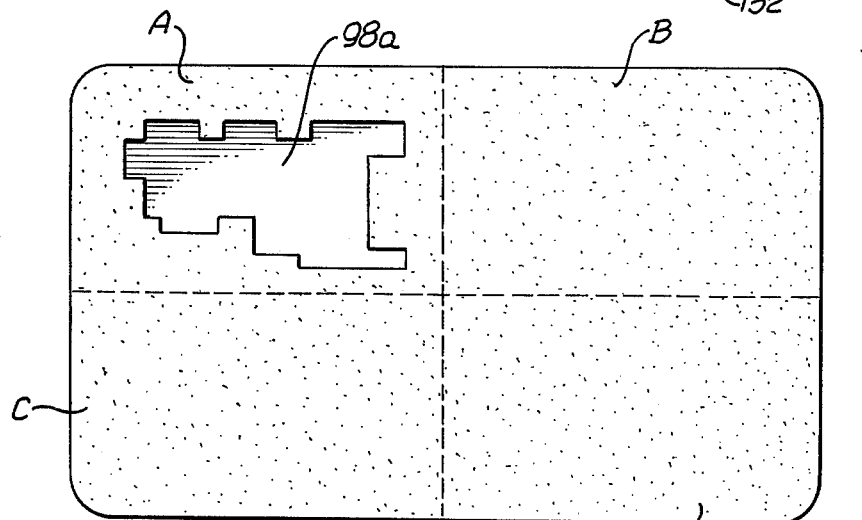
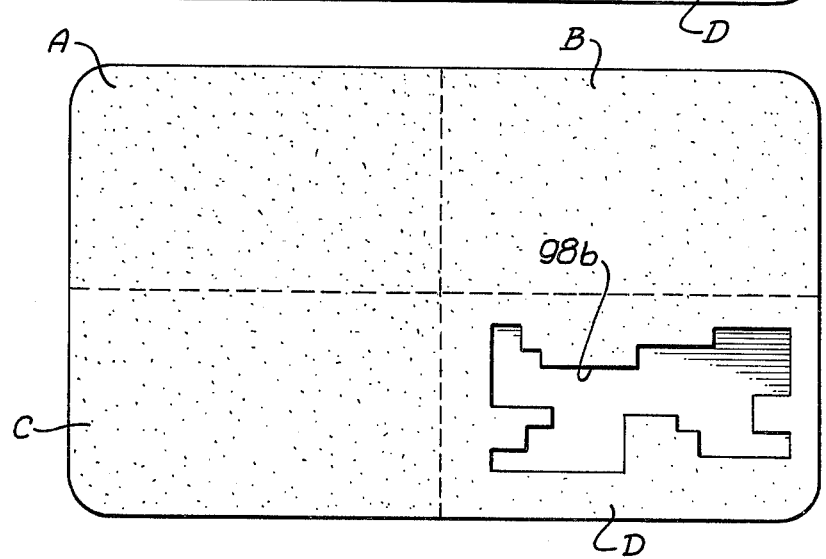
FIG. 11.

PRINTED CIRCUIT BOARD CIRCUIT TESTER

CROSS-REFERENCE TO RELATED APPLICATION

This application is a continuation-in-part of U.S. application Ser. No. 603,332 filed Aug. 11, 1975, now abandoned.

BACKGROUND OF THE INVENTION

The invention relates to testing equipment for printed circuit boards. In the prior art there are vacuum operated printed circuit board testers, but they are relatively complicated and expensive in comparison with the present invention. Generally, they tend to warp the printed circuit boards by the application of the vacuum and they have vacuum leakage problems so as to be inefficient. Where elastomeric foam layers are used between the board and the vacuum chamber, the prior art testers tend to disfigure the foam causing excess wear and reduction in thickness in the foam layers.

The present invention eliminates the foregoing problems. In addition, the tester according to the present invention is easy to maintain and provides for easy replacement of the elastomeric foam layers and test circuitry.

SUMMARY OF THE INVENTION

The present invention is a simply constructed printed circuit board tester, less complicated than those in the prior art. It includes an arrangement of supporting foam pads for the board being tested so as to assure minimum distortion of the board, which is adequately held in place and requires a lower pressure differential than the prior art.

In the preferred embodiment of the invention an elastomeric member constitutes a diaphragm defining one wall of a normally expanded main chamber communicating with means for exhausting air to produce a vacuum therein. The diaphragm supports, exteriorly of the main chamber, a resilient pad which is provided with a cutout portion configured to the outline of a circuit board to be tested so as to provide a seal against the edges thereof; this arrangement being such that when a circuit board is properly placed thereon a second, smaller chamber will be defined by the diaphragm, the resilient pad and the circuit board. Openings are provided in the diaphragm which are of sufficient size to exhaust air from the second chamber when a vacuum is produced in the first mentioned chamber, and electrical contacts extend through said openings, presenting ends engageable by a circuit board positioned as described above when air is exhausted from said chambers and said chambers consequently are diminished in volume. Preferably, an additional compressible pad is interposed between the diaphragm and the resilient, cut-out pad to reduce distortion of large circuit boards during testing, but in many applications of the tester such an additional pad is unnecessary.

In another embodiment of the broad invention, a pressure hood is provided which may be opened to place and remove circuit boards from gesting position and closed to permit application of positive air pressure exteriorly of a circuit board positioned for testing; the chambers described above being open to the atmosphere instead of communicating with an air exhausting means as above described. This structure is otherwise the same as has been described.

In both embodiments, the electrical contacts are adapted for connection to a computer appropriately programmed to test the various circuits as is well known in the art.

Accordingly, it is an object of the invention to provide an improved printed circuit board tester.

It is another object of the invention to provide a printed circuit board tester having improved foam pads for supporting the board on the tester when a pressure differential is applied.

It is a further object of the invention to provide a circuit board tester, as described in the preceding paragraphs, in which a second chamber is created between the board support pads and the board being tested.

It is a still further object of the invention to provide a circuit board tester, as described in the preceding paragraphs, having improved positioning or board locking means which are spring supported to provide tolerances.

It is another object of the invention to provide a circuit board tester, as described in the preceding paragraphs, including switch means for automatically applying a pressure differential to the circuit board when it is positioned on the tester.

It is still another object of the invention to provide a circuit board tester, as described in the preceding paragraphs, in which a chamber is supported by an enclosing dust cover and from which the chamber may be raised on hinges to expose the electrical wiring for work thereon.

It is a further object of the invention to provide a circuit board tester, as described in the preceding paragraphs, in which, in the preferred embodiment, the vacuum requirement and the vacuum leakage are less than in the prior art devices.

Further objects and advantages of the invention may be brought out in the following part of the specification wherein certain small details have been described for completeness of the disclosure of the preferred embodiment without intending to limit the scope of the invention which is set forth in the appended claims.

BRIEF DESCRIPTION OF THE DRAWINGS

Referring to the accompanying drawings, which are for illustrative purposes:

FIG. 4 is a cross-sectional view, taken along the line 4—4 in FIG. 1;

FIG. 5 is a plan view, taken along the line 5—5 in FIG. 2;

FIG. 6 is a fragmentary enlarged cross-sectional view, taken along the line 6—6 in FIG. 1;

FIG. 10 is a central cross-sectional view of a modified embodiment of the invention; and FIG. 11 is a view in plan of a set of sealing foam sheets having different configurations of cut-away central portions for use with multiple-unit testers as hereinafter described.

DESCRIPTION OF THE PREFERRED EMBODIMENTS

Figure 1:
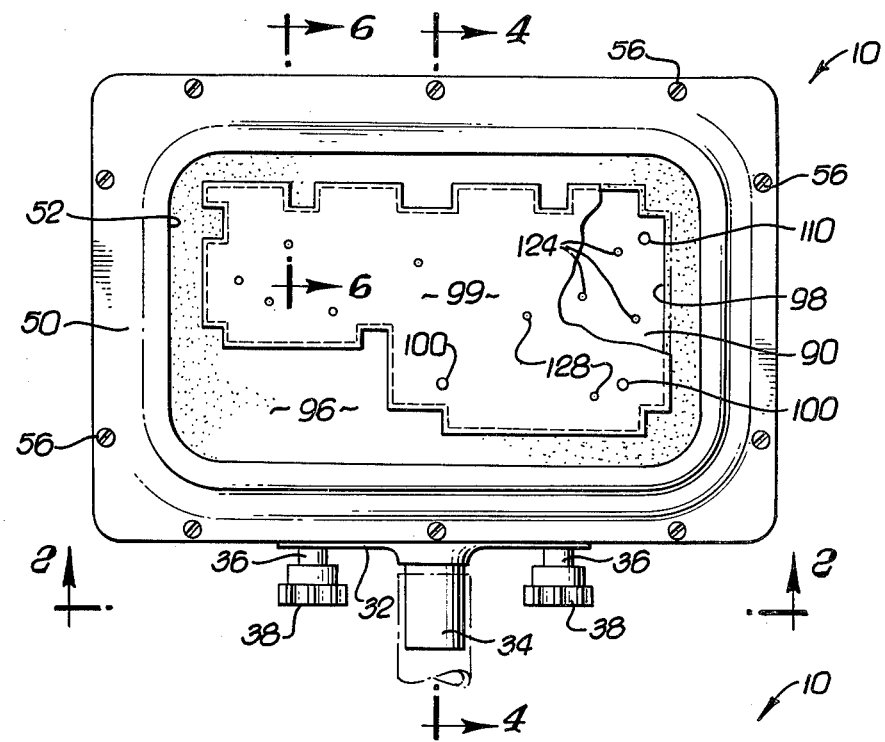
FIG. 1 is a top plan view of the preferred embodiment of a printed circuit board tester, embodying the invention.
Figure 2:
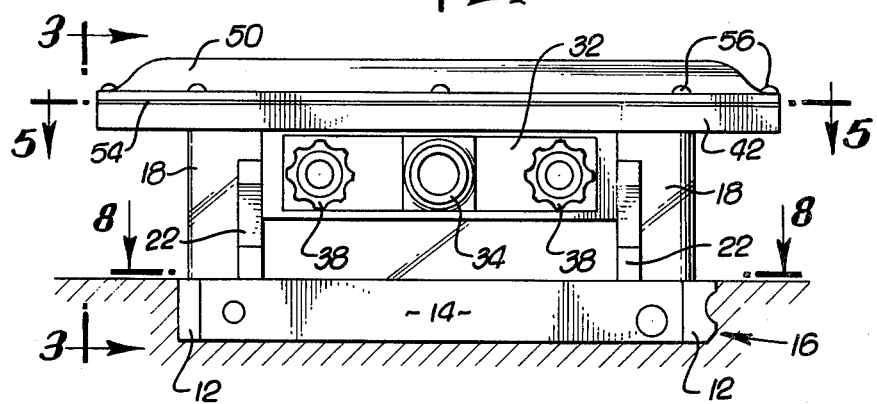
FIG. 2 is a side elevational view of the tester of FIG. 1, taken along the line 2—2 in FIG. 1.
Figure 3:
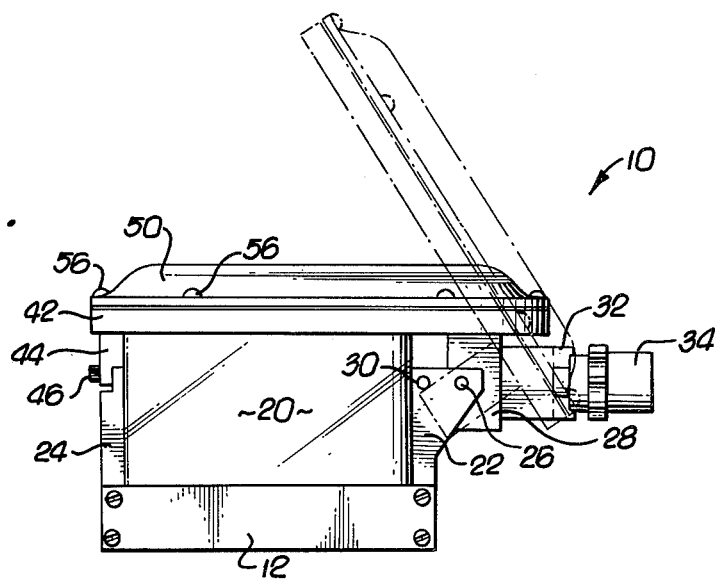
FIG. 3 is an end elevational view of the tester of FIG. 1, taken along the line 3—3 in FIG. 2.

Referring again to the drawings, in FIGS. 1–3 the exterior of the printed circuit board tester, generally designated as 10, is shown. Along its lower end are end frame members 12 and side frame members 14 which are adapted for engagement in surrounding structure, generally designated as 16, which has a rectangular opening to receive the generally rectangular lower end of the tester. Supported on the lower frame members are side dust cover panels 18 and end dust cover panels 20. Also supported on the lower frame members 14 are pivot support posts 22 and on the opposite side are support posts 24. Adjacent their upper ends the pivot supports 22 have horizontal inwardly extending pins 26, which are pivotally engaged with an elongated, generally rectangular block 28, forming a frame for vacuum manifold outlet. Extending horizontally and inwardly from the posts 22 are pins 30 which limit the upward pivoting movement of the block 28, as shown in FIG. 3, the block 28 being shown in phantom outline in the pivoted position. Secured to the block 28 is a generally rectangular block-shaped vacuum source connection 32 having a tube 34 extending outwardly therefrom for connection with a vacuum source. The source connection block 32 is secured to the block 28 by rotatable pins 36 having knobs 38.

Figure 9:
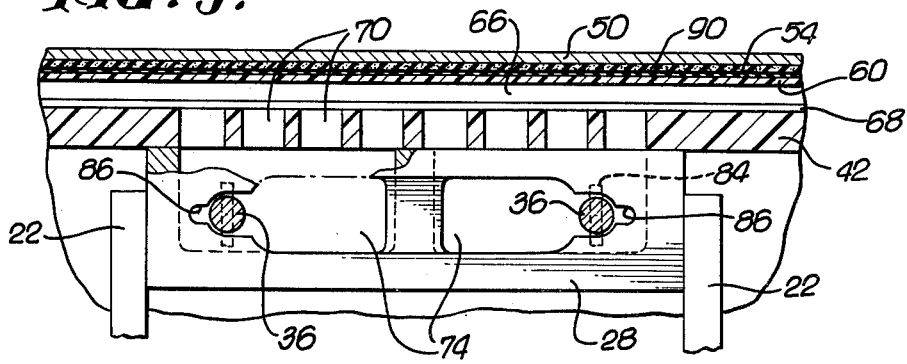
FIG. 9 is a cross-sectional view, taken substantially along the lines 9—9 in FIG. 4.

As shown in FIG. 9, the pins 36 sealingly secure the vacuum source block 32 to the block 28 by rotation of the pins 36 and dogs 84 at their inner ends, from a horizontal position to the vertical position shown, after the dogs have passed through horizontal slots 86 in the block 28.

Supported on the block 28 is a phenolic, generally rectangular vacuum chamber base member 42, adapted to be pivoted upwardly with the block 28, as shown in FIG. 3. Extending downwardly from the base member 42, as shown in FIG. 3, are vertical posts 44 in overlapping contact with the posts 24 and secured thereto by hand tightenable screws 46, as shown in FIGS. 3 and 4. The engagement of the screws 46 prevents the pivoting of the block 28.

A marginal, upper molded fibreglas retainer 50, having a large generally rectangular central opening 52, extends over the edges of an elastomeric diaphragm or vacuum operable means 54. The diaphragm has its edges on those of the base member 42 and is sealingly secured thereto by the retainer 50 held in place by peripherally spaced screws 56.

As shown in FIGS. 4–7 and 9, the diaphragm 54 is spaced upwardly from the base member 42 by a generally rectangular, flat, rigid fibreglas sheet 60 and coil springs 62 in abutment with the lower side of the sheet 60, and having their lower ends secured in recesses 64 in the base member. Secured on the upper surface of the base member are elastomeric stop pads 68 which limit the downward movement of the sheet 60 and assure a vacuum passage along the top of the base member. A main vacuum chamber 66 is formed between the diaphragm and the base member, the chamber being connected to the vacuum source by a manifold formed by a plurality of vertical bores 70 (FIGS. 4 and 5) through the base member in communication with horizontal, elongated spaced passages 72 in the block 28. The block 28 has an elongated opening 74 (FIG. 9) connecting the passages 72 to an elongated horizontal passage 78 in the source connection 32. The passage 78 is at right angles to a tubular opening 80 in the vacuum source connection.

Secured on the upper outer face of the diaphragm 54 is an elastomeric, generally rectangular, highly resilient but relatively firm foam pad 90, having its edges under the retainer 50 just outwardly of the opening 52. The foam sheet or pad 90 is positioned horizontally by means of two pins 92 secured within the base member, as shown in FIGS. 4 and 5. Loosely positioned on the pad 90 is an elastomeric, highly resilient foam sealing and spacing pad 96, having a patterned cut-out central portion 98 so as to expose a central portion of the pad 90 from the top, as shown in FIG. 1. Configuration of the cut-out portion 98 is determined by the printed circuit board tested, as 99, the circuits therein being exposed therethrough to the pad 90. The outer periphery of the pad 96 fits within the opening 52 in the retainer 50. The pad 96 is very soft, substantially collapsible, and about half as thick as the pad 90. The resilience in the pad 90 accommodates protrusions on the lower surface of the board 99, permitting the board to settle thereon.

Spring mounted in the base member 42 are two printed circuit board positioning and locking pins 100, the lower end of coil springs 102, as shown in FIG. 4, being on the upper surface of the base member, and the upper ends of the springs being in contact with collars 104 fixed to the pins and in abutment with the rigid sheet 60. The pins 100 are used to position and lock the circuit board to be tested, predetermined openings in the board being adapted to fit over the pins. The spring mounting is provided so as to permit tolerances in the boards and so as to avoid binding of the boards with the pins when the vacuum is applied.

As shown in FIGS. 1, 4 and 5, a switch actuating pin 110 extends through the vacuum chamber, the cut-out portion 98, and is slidably engaged in the base member, the sheet 60, the diaphragm and the pad 90. Its lower end is supported by a leaf spring 112 which, when depressed, closes a switch 114 so as to cause the vacuum to be applied to the vacuum chamber. The actuating pin 110 is automatically moved downwardly to close the switch when a circuit board, as 99, is positioned thereon, as shown in FIG. 4.

As shown in FIGS. 1 and 4–7, predeterminedly positioned and fixed in the base member are a plurality of electrical contacts 124, each being in a non-conducting environment extending through the vacuum chamber and respective openings, generally designated as 128, in the sheet 60, the diaphragm and the pad 90. Extending downwardly from the contacts 124 are respective wires 130 secured to respective lower electrical contacts 132. Each of the contacts 132 is positioned in vertical cylindrical openings 138 in a phenolic patchboard 136, shown in plan view in FIG. 8, secured within the members 12 and 14. The contacts 132 are adapted to be connected to a computer, programmed to test particular circuits in a printed circuit board, as 99.

Figure 7:
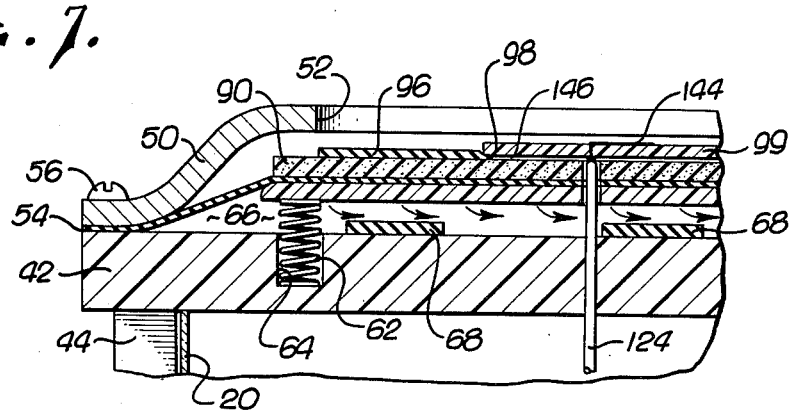
FIG. 7 is a view similar to that in FIG. 6, illustrating the effect of the application of the vacuum to the chamber.
Figure 8:
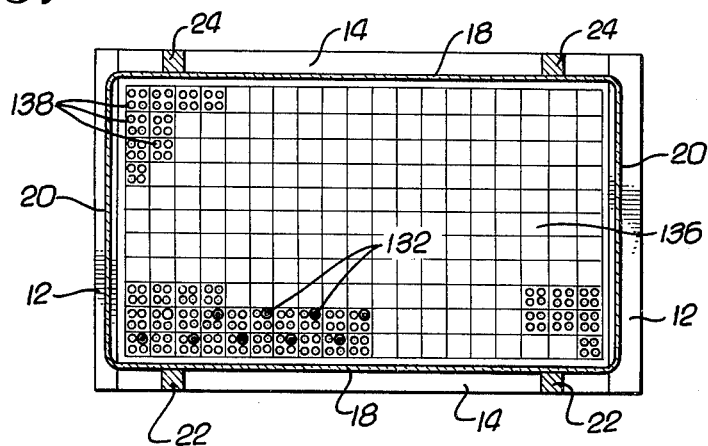
FIG. 8 is a plan view, taken along the line 8—8 in FIG. 2.

Thus, in operation, a circuit board 99 to be tested has circuits 144 (FIG. 6) and marginal edges 140 extending beyond the opening 98, as shown in FIGS. 4 and 6, so as to overlap the pad 96 and be spaced from the pad 90 when positioned on the tester, two holes in the board being fitted on the pins 100, and when so fitted being positioned on the switch actuating pin 110 so as to cause the vacuum to be applied to the main chamber 66 and also to a second chamber 146. In FIG. 7, the tester is illustrated with the vacuum being applied, the sheet 60, the diaphragm, the pad 90, the pad 96 and the board 99 all having been moved downwardly by the vacuum. The sheet 60 is not shown to be in contact with the pad 68, but if sufficient amount of vacuum were applied, such contact could be made and after further compressing the springs 62.

When the vacuum is applied, the suction is exerted within the main chamber 66 and also within the openings 128 and into the space bounded by the underside of the board 99, within the opening 98 of the pad 96, and the top of the pad 90, which space becomes the second vacuum chamber 146, the pad 96 forming a seal. The downwardly pulling force on the board 99 substantially collapses the inner edges of the soft sealing pad 96, compresses the pad 90 according to the lower surfaces on the board, and the entire structure from the board 99 to the rigid sheet 60 is moved downwardly so that predetermined circuits, as 144, in the circuit board make contact with the contacts 124, whereby in accordance with computer programming, each individually selected circuit on the board is tested; the test results being shown on a computer tape readout.

The vacuum applied may be as little as 5 inches of mercury, and when the test is completed, it is shut off, according to the computer program, thus allowing the springs 62 to return the printed circuit board to the upper position shown in FIG. 6. The board is then removed and another one is positioned for testing.

As indicated above, the particular structure provides a unique testing arrangement in which the printed circuit boards are protected against warpage and around which there is no significant vacuum leakage. The structure also is such as to cause only minimal wear on any of the working parts, including the foam pads. The same pads 90 and 96 and contacts are used for the same circuit board, and different pads and electrical leads are provided for each type of board.

The arrangement permitting the upward tilting of the base member 42 and the testing structure secured thereto provides for easy working with the electrical contacts and other parts within the dust cover.

In the modified embodiment illustrated in FIG. 10 the structure is the same as that of the preferred embodiment, except as hereinafter described, and the same reference numerals therefore have been employed for the parts which are the same.

In this embodiment positive air pressure is applied exteriorly of the circuit board being tested, thus creating a pressure differential across the elastomeric member 54 just as does the creation of a vacuum below the member 54 in the preferred embodiment. For this purpose, the chambers 66 and 146 must be in communication with the atmosphere and the block 28 with its vacuum source connections shown in FIG. 4 are unnecessary. Similarly, the switch 114 of FIG. 4 is omitted because the circuit board's upper surface must be enclosed before positive pressure is applied exteriorly of it.

Such enclosure is effected by means of a hood 200 connected by means such as a tube 201 to an air supply (not shown) and hinged at one edge to the retainer 50 by means such as a flexible strip 202 secured to the hood 200 at one edge and at the opposite edge to the retainer 50, thus providing a seal which may be flexed to permit the hood to be raised to place and remove circuit boards to be tested.

The hood 200, when closed, completely encloses the central opening 52 of the retainer 50 and has mounted on its edges other than its hinged edge a compressible sealing member 203 adapted to seal against a lip extension 204 of retainer 50. Compression of the sealing member 204 may be effected by the weight of the hood 200 alone, since only low air pressure within the hood is required to produce a sufficient pressure differential across the elastomeric member 54 to bring a circuit board in testing position into engagement with contacts 124. Moreover, with an air supply of adequate capacity a perfect seal is not required. However, auxiliary means for compressing the member 203 may be employed if desired.

In operation, the hood 200 is raised, a circuit board to be tested is placed in the proper position, the hood 200 is lowered to sealing position, and air under pressure is admitted to the interior of hood 200 through tube 201. This creates a pressure differential across elastomeric member 54 equivalent to that produced by the vacuum in the preferred embodiment and the same end result is achieved.

In practice, it is most convenient and economical to build into a common frame a plurality of testing units sharing a common chamber 66, but each permanently or semi-permanently wired to test various circuit board configurations. Such a multiple testing unit may be used to test any of a plurality of such boards merely by substitution, in either of the described embodiments, of one of a plurality of sealing and spacing pads 96a, 96b such as those shown in FIG. 11. These correspond in structure and function to the sealing and spacing pad 96 of FIG. 1, but are, for example, of four times the area, having quadrants A, B, C and D each overlying a related group of testing contacts 124.

In operation of such a device, when one configuration of board is to be tested, pad 96a is positioned in the tester and the board is placed on its cut-out portion 98a for testing; the rest of the area of pad 92a, being imperforate, meanwhile sealing the balance of chamber 66. If a differently configured board is to be tested, the pad 96b is substituted and the board is placed over its cut-out portion 98b; the rest of the area of pad 96b, being imperforate, meanwhile sealing the balance of chamber 66. In the case of a multiple testing unit having four groups of related testing contacts 124, two additional pads similar to the pads 96a and 96b would be provided. These would have cut out portions configured to different circuit board configurations, located respectively in the quadrants designated B and C.

The invention and its attendant advantages will be understood from the foregoing description, and it will be apparent that various changes may be made in the form, construction and arrangements of the parts of the invention without departing from the spirit and scope thereof or sacrificing its material advantages, the arrangements hereinbefore described being merely by way of example. I do not wish to be restricted to the specific forms shown or uses mentioned except as defined in the accompanying claims.

I claim:

1. A printed circuit board circuit tester comprising: a vacuum chamber, a vacuum source connection to said chamber, a chamber base, vacuum operable means defining a part of said chamber, supporting means in said chamber associated with said vacuum operable means, internal flexible means in said chamber supporting said supporting means and said vacuum operable means away from said base, external flexible means outwardly of said chamber associated with said vacuum operable means, spacing flexible means on said external flexible means having an opening therethrough, said spacing flexible means being adapted to support a printed circuit board to be tested, said opening in said spacing flexible means being adapted to permit the circuits to be tested to be in communication with said external flexible means, electrical contacts secured to and extending through both sides of said base, and openings through said supporting means, through said vacuum operable means, and through said external flexible means being in respective alignment, one end of each electrical contact being adapted to extend into said vacuum chamber, into a respective said opening through said supporting means, into a respective said opening through said vacuum operable means and into a respective said opening through said external flexible means, whereby when a vacuum is applied to said chamber, a printed circuit board, supported on said spacing flexible means and in communication with said external flexible means, is moved toward said base with said external flexible means, said vacuum operable means, and said supporting means, so that the circuits on said board make predetermined contact with said electrical contacts.

2. The invention according to claim 1 in which: a framed enclosure supports said chamber below its base, and a board within said enclosure having openings therethrough to receive the other ends of respective contacts for connection externally of said enclosure.

3. The invention according to claim 1 including: positioning means associated with said chamber to position a circuit board in place on said spacing flexible means in a predetermined location with respect to said contacts.

4. The invention according to claim 3 in which: said positioning means are spring mounted pins secured to said base and extend outwardly of said external flexible means, said pins being adapted to receive a printed circuit board through predetermined openings therein so as to position and lock said board in place.

5. The invention according to claim 1 in which: said vacuum operable means is a diaphragm secured to said base, said supporting means being a flat rigid member in contact with said diaphragm and being between said base and said diaphragm, and said internal flexible means being springs supported by said base and being in contact with said supporting means.

6. The invention according to claim 5 in which: said external flexible means is a flat elastomeric pad in support contact with an exterior surface of said diaphragm.

7. The invention according to claim 6 in which: said pad is made of synthetic foam.

8. The invention according to claim 1 in which: said spacing flexible means is a resilient foam pad.

9. The invention according to claim 8 in which: said foam pad is thin enough and soft enough so as to substantially collapse when supporting a circuit board when said vacuum is applied, defining a seal between the circuit board said external flexible means.

10. The invention according to claim 1 including: a vacuum source starting switch having an actuator extending outwardly of said external flexible means and in position so as to be actuated by the positioning of a printed circuit board on said spacing flexible means for circuit testing.

11. The invention according to claim 1 including: interrupted means in said chamber on said base in position to stop said supporting means when said vacuum is applied.

12. The invention according to claim 4 in which: said vacuum operable means is a diaphragm secured to said base, said supporting means being a flat rigid member in contact with said diaphragm and being between said base and said diaphragm, and said internal flexible means being springs supported by said base and being in contact with said supporting means, said external flexible means being a flat elastomeric pad in supported contact with an exterior surface of said diaphragm, said spacing flexible means being a resilient foam pad, said foam pad being thin enough and soft enough so as to substantially collapse when supporting a circuit board when said vacuum is applied, and defining a seal between the circuit board said external flexible means, and a vacuum source starting switch having an actuator extending outwardly of said external flexible means and in position so as to be actuated by the positioning of a printed circuit board on said spacing flexible means for circuit testing.

13. The invention according to claim 2 in which: said vacuum source connection extends downwardly from said base, said base being hingedly connected to said framed enclosure so that said chamber can be tilted to expose the underside of said base and said board within said enclosure.

14. The invention according to claim 13 including: a protective retainer having a central opening, said retainer being outwardly of said chamber and being secured to said base along the periphery of said vacuum operable means, said spacing flexible means being adapted to fit within said central opening.

15. A printed circuit board circuit tester comprising a base, an elastomeric member carried by said base, means for supporting a circuit board to be tested comprising a rigid plate engaging a portion of the area of said elastomeric member, and a resilient pad carried by said elastomeric member and provided with a cut-out portion internally of the edges thereof for sealing against the edges of a circuit board when positioned thereon, electrical contact means extending from said base through openings in said rigid plate and said elastomeric member to adjacent the position of a circuit board carried on the edges of said cut out portion, and means for causing flexing of the portion of said elastomeric member not engaged by said rigid plate, in a direction and to an extent sufficient to move a circuit board so carried into engagement with said electrical contact means.

16. The invention according to claim 15 in which said electrical contact means are disposed in a plurality of groups and in which a plurality of sheets are provided each having a cut out portion positioned to expose only one of said groups of electrical contact means.

17. The invention according to claim 15 in which said means for causing flexing of said elastomeric member creates an air pressure differential at opposite sides of said member.

18. The invention according to claim 17 in which said air pressure differential is created by reducing the air pressure on the side of said member opposite that carrying said resilient pad.

19. The invention according to claim 17 in which said air pressure differential is created by applying air under greater than atmospheric pressure on the side of said member carrying said resilient pad.

20. A printed circuit board circuit tester comprising a base, an elastomeric member carried by said base and defining one wall of a first chamber means for supporting a circuit board to be tested comprising a rigid plate engaging a portion of the area of said elastomeric member, a first resilient pad, substantially coextensive in area with said plate, carried by said elastomeric member outside said chamber, and a second resilient pad having a cut out portion inwardly of the edges thereof, carried by said first resilient pad; said first and second pads in conjunction with a circuit board positioned with its edges overlapping said cut out portion defining a second chamber, electrical contact means extending from said base through openings in said rigid plate, said elastomeric member and said first resilient pad, to adjacent the position of a circuit board carried on the edges of said cut out portion, and means for simultaneously reducing the volume of said first and second chambers by creating a pressure differential across said elastomeric member; whereby a circuit board so carried will be moved into engagement with said electrical contact means.

* * * * *